(12) United States Patent
Perruchot et al.

(10) Patent No.: US 8,076,169 B2
(45) Date of Patent: Dec. 13, 2011

(54) METHOD OF FABRICATING AN ELECTROMECHANICAL DEVICE INCLUDING AT LEAST ONE ACTIVE ELEMENT

(75) Inventors: Francois Perruchot, Grenoble (FR); Bernard Diem, Echirolles (FR); Vincent Larrey, La Murette (FR); Laurent Clavelier, Grenoble (FR); Emmanuel Defay, Vorepe (FR)

(73) Assignee: Commissariat A L'energie Atomique (FR)

( * ) Notice: Subject to any disclaimer, the term of this patent is extended or adjusted under 35 U.S.C. 154(b) by 0 days.

(21) Appl. No.: 12/488,882

(22) Filed: Jun. 22, 2009

(65) Prior Publication Data
US 2009/0317931 A1    Dec. 24, 2009

(30) Foreign Application Priority Data
Jun. 23, 2008  (FR) ..................... 08 03497

(51) Int. Cl.
*H01L 21/00* (2006.01)
(52) U.S. Cl. ............ 438/52; 438/50; 438/517; 438/455; 438/459; 257/E29.324; 257/E21.219; 257/619; 257/415
(58) Field of Classification Search .................. 438/517, 438/455, 459, 52, 50; 257/347, E29.273
See application file for complete search history.

(56) References Cited

U.S. PATENT DOCUMENTS

| | | | |
|---|---|---|---|
| 2005/0112843 A1* | 5/2005 | Fischer et al. | 438/455 |
| 2007/0072391 A1* | 3/2007 | Pocas et al. | 438/455 |
| 2008/0099860 A1* | 5/2008 | Wuertz | 257/415 |
| 2008/0138922 A1* | 6/2008 | Wan | 438/52 |
| 2008/0261055 A1* | 10/2008 | Chu et al. | 428/428 |
| 2008/0283917 A1* | 11/2008 | Cheng et al. | 257/347 |

FOREIGN PATENT DOCUMENTS

| | | |
|---|---|---|
| EP | 0 554 795 A | 8/1993 |
| FR | 2 906 078 A | 3/2008 |

OTHER PUBLICATIONS

International Search Report for French Application No. 08/03497, filed Jun. 23, 2008.

* cited by examiner

*Primary Examiner* — Matthew Smith
*Assistant Examiner* — Wilner Jean Baptiste
(74) *Attorney, Agent, or Firm* — Alston & Bird LLP

(57) ABSTRACT

The invention relates to a method of fabricating an electromechanical device including an active element, wherein the method comprises the following steps:

a) making a monocrystalline first stop layer on a monocrystalline layer of a first substrate;

b) growing a monocrystalline mechanical layer epitaxially on said first stop layer out of at least one material that is different from that of the stop layer;

c) making a sacrificial layer on said active layer out of a material that is suitable for being etched selectively relative to said mechanical layer;

d) making a bonding layer on the sacrificial layer;

e) bonding a second substrate on the bonding layer; and f) eliminating the first substrate and the stop layer to reveal the surface of the mechanical layer opposite from the sacrificial layer, the active element being made by at least a portion of the mechanical layer.

14 Claims, 3 Drawing Sheets

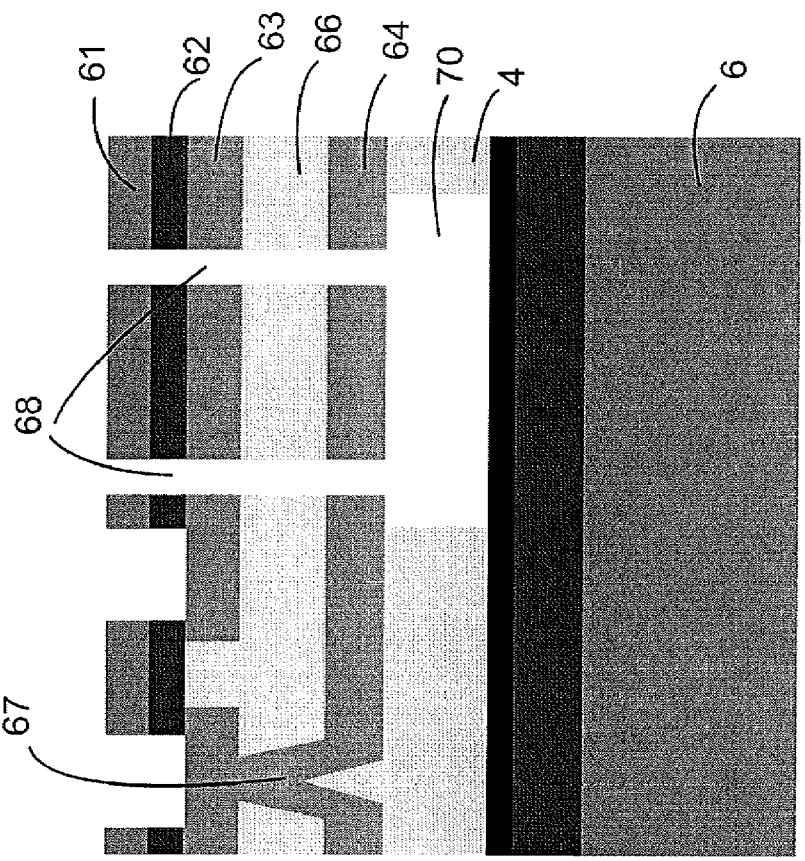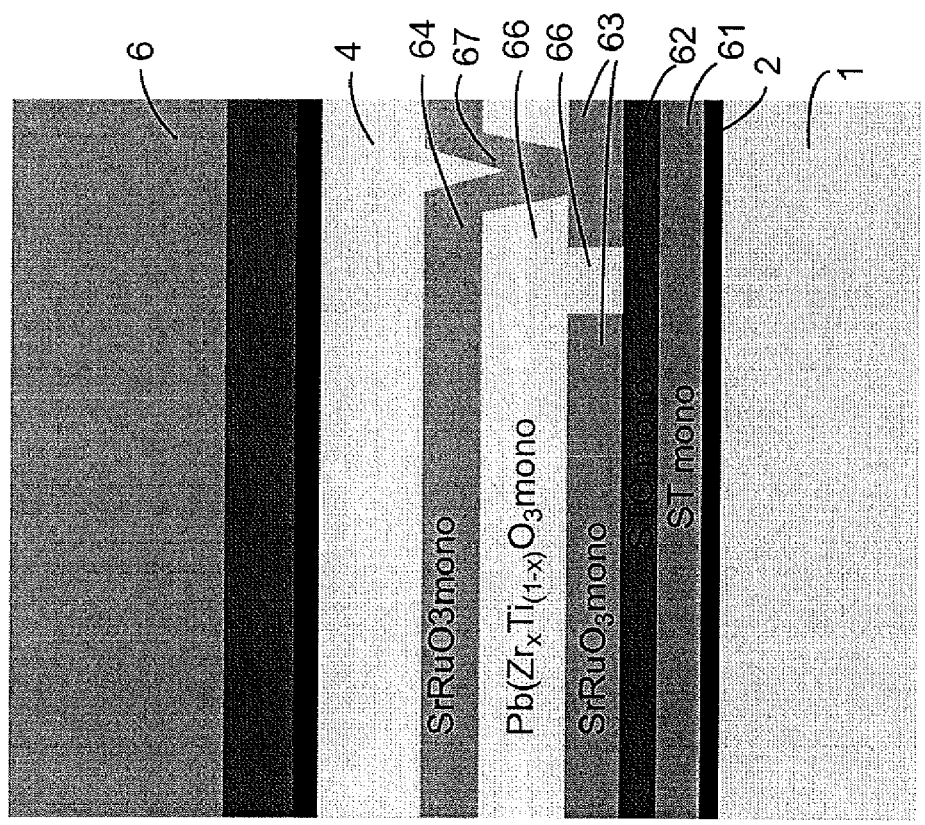

METHOD OF FABRICATING AN ELECTROMECHANICAL DEVICE INCLUDING AT LEAST ONE ACTIVE ELEMENT

FIELD OF THE INVENTION

The present invention relates to a method of fabricating an electromechanical device including at least one active element.

BACKGROUND OF THE INVENTION

So-called "surface" technologies (in contrast to bulk technologies) enable the size of electromechanical structures made on silicon to be reduced (micro-electromechanical systems (MEMS) and/or nano-electromechanical systems (NEMS). These technologies rely on using a stack of at least three layers: a mechanical layer (of thickness typically lying in the range 0.1 micrometer ($\mu m$) to 100 $\mu m$); a sacrificial layer (of thickness typically lying in the range 0.1 $\mu m$ to a few $\mu m$); and a support (of thickness typically lying in the range 10 $\mu m$ to 1000 $\mu m$). Selective chemical etching of the sacrificial layer serves to make functional structures in the mechanical layer that are locally independent of the support.

The non-etched zones of the sacrificial layer enable so-called "anchor" zones to be made whereby the mechanical structure is connected to the support.

A given method is characterized in particular by the choice of materials for the pair of materials comprising the mechanical layer and the sacrificial layer, and by the choice of method of enabling them to be associated with the support.

The choice of method is based on various criteria depending on the type of component to be made, however in order to have a method that is flexible and suitable for being adapted to a wide range of requirements, e.g. for making a mechanical layer on a sacrificial layer, the main criteria involved are as follows:
  the quality of the mechanical layer, firstly the stability of its mechanical properties, but also the precision available for controlling its dimensions, in particular the precision concerning its thickness;
  and/or the possibility of controlling the lateral dimensions of the anchor zones by inserting, in the sacrificial layer, zones that are not attacked by the chemical etching, so as to avoid being dependent on achieving control by controlling the duration of etching, which is sensitive to design;
  and/or the possibility of having one or more levels of electrical interconnections above and/or below the mechanical layer, suitable for being used as electrodes, where necessary.

The family of methods in the most widespread use relies on silicon and silica as the pair of materials for the mechanical layer and the sacrificial layer respectively, associated with selective etching of the silica by HF (in liquid or vapor form). This family forms part of the silicon-on-insulator (SOI) MEMS family of methods.

The simplest SOI-MEMS methods make two $SiO_2/Si$ layers by successively depositing materials: $SiO_2$ thermally or by chemical vapor deposition (CVD) which may be plasma-enhanced (PECVD), low pressure CVD (LPCVD), or atomic layer CVD (ALCVD) if very fine; Si by CVD of the PE, LP, or reactive plasma (RP) type, or depositing a very fine atomic layer (ALD) on a silicon support such as a solid silicon substrate.

These methods are advantageous because:
  the thickness of the mechanical layer is controlled by the duration of the deposition of the silicon layer;
  any anchor zones are very well controlled since it is possible to make use directly of the mechanical layer by locally etching the oxide layer prior to depositing the silicon; and
  it is possible to make interconnections at different levels.

Nevertheless, the silicon constituting the mechanical layer deposited on the oxide is polycrystalline silicon, thereby making it more difficult to control its mechanical qualities (stresses, stability, ... ) and it is possible to reach a thickness limit.

Known improvements to those methods make it possible to use monocrystalline silicon as the mechanical layer, it being considered that the mechanical properties of monocrystalline silicon are better and that the range of available thicknesses is larger.

Mention may also be made of three large families of known methods of making an MEMS with a monocrystalline silicon mechanical layer by using SOI-MEMS technology, which families differ in the method used for making the substrate that includes the complete stack:

1) The initial substrate is a fine SOI substrate of the microelectronic type having controlled thickness (typically of the order of 100 nanometers (nm)), e.g. made by cleaving using the "Smart Cut" technology (registered trademark). The $SiO_2$ layer that acts as an insulator relative to the substrate is used as a sacrificial layer and the fine silicon layer is used as a basis for growing silicon epitaxially, thereby enabling its monocrystalline nature to be conserved.

It is also known to make interconnection levels above the mechanical layer SiN or polycrystalline Si anchors as described in the article "Polysilicon packaging and a new anchoring technology for thick SOI-MEMS—dynamic response model and application to over-damped inertial sensors" by B. Diem et al., published in the 13th International Conference on Solid State Sensors, Actuators, and Microsensors, Seoul, Jun. 5-9, 2005, pp. 527-530.

2) The initial substrate is a silicon substrate including an oxide layer. The mechanical layer is made by bonding a thick second silicon substrate which is then thinned by rectification and polishing (see for example application WO 2006/035031). With that method, the sacrificial layer is used as a bonding layer; the quality of bonding is critical since it must guarantee that chemical etching is uniform. It is possible to implement anchor zones in the sacrificial layer prior to bonding, but that requires the ability to control bonding on heterogeneous substrates.

3) The initial substrate is a thick silicon substrate having a sacrificial oxide layer deposited thereon followed by a functionalization multilayer structure comprising SiN associated with polycrystalline Si and finally a top bonding layer of polycrystalline Si. That initial stack is bonded onto a second silicon substrate that acts as a support. The thick base substrate is then thinned by rectification followed by polishing so as to make the mechanical layer. Reference can be made for example to the article by T. Yamamoto et al., ("Capacitive accelerometer with high aspect ratio single crystalline silicon microstructure using the SOI structure with polysilicon-based interconnect technique", published in MEMS 2000, the 13th International Annual Conference, Jan. 23-27, 2000, Miyazaki, Japan, pp. 514-519). The proposed method makes it possible to use polycrystalline Si to make anchor zones, interconnection layers, and buried electrodes, and the bonding layer is distinct from the sacrificial layer, and thus the quality of bonding is much less critical since it performs mechanical functions only.

Of the above-mentioned methods, only method 1) enables the thickness of the mechanical layer to be controlled accurately. Thinning the base substrate to obtain the mechanical layer as proposed in methods 2) and 3) can be performed at present with accuracy no better than about ±0.5 µm (under the best of circumstances and on 200 mm wafers) and it depends on the fluctuations in the thicknesses of the silicon substrates used. When the thickness of the structures is of the order of a few µm, such precision is not sufficient, in particular when the thickness is used to dimension elasticity, as applies for example with force sensors; in general, it is desired to obtain sensitivity variation of less than 10%, it being understood that sensitivity varies with the cube of thickness.

For method 1), thickness is determined by the duration of the epitaxial growth of the fine layer of Si, thereby providing much better accuracy. This principle is proposed to improve method 2) by using as the second substrate an epitaxially-grown SOI substrate.

However, under all circumstances, modified method 1) or method 2) are methods that are not as flexible as method 3), which makes it possible simultaneously to make both etching stops and buried electrodes.

Known layer transfer methods of making substrates are well adapted to controlling the thicknesses of the layers, but they are used for making a structure constituted by a layer on insulation, typically on oxide. The bonding operation is thus performed via said layer which for methods of fabricating MEMS type electromechanical structures is used as a sacrificial layer. As emphasized above, bonding is then critical since its quality depends on the uniformity of the etching and on the ability to control its speed.

At present there does not exist a method that is well adapted to making MEMS type electromechanical structures and that enables the thickness of the active layer to be controlled with precision.

OBJECT AND SUMMARY OF THE INVENTION

An object of the present invention is to provide a flexible method enabling MEMS/NEMS to be made of monocrystalline silicon using technology that is based on SOI, for example, in which it is possible to control thickness, including small thicknesses, while maintaining a fabrication temperature that is compatible with the materials present.

The invention makes it possible in particular to achieve an advantageous development of a piezoelectric stack used for bulk acoustic wave (BAW) type structures, for which the criterion for selecting the fabrication method can be associated with the physical qualities of the materials that can be used. In this context, it is desirable to be able to use certain materials in thin layers in monocrystalline form so as to make it possible, including at small thicknesses, to obtain physical properties that are close to the properties of a bulk monocrystal or that are at least better than those obtained with amorphous or polycrystalline films obtained by sol-gel deposition. This applies for example to lead zirconate titanate (PZT) that can be grown epitaxially from a transition layer on monocrystalline silicon (see the article "Epitaxial growth of $Pb(Zr_{0.2}Ti_{0.8})O_3$ on Si and its nanoscale piezoelectric properties" by A. Lin et al., Applied Physics Letters, Vol. 78-14, Apr. 2, 2001). The same applies to lead magnesium niobate tantanate (PMNT).

Under such circumstances, thickness control is particularly important given that the piezoelectric layers are generally thin, typically lying in the range 100 nm to a few µm.

The invention thus provides a method of fabricating an electromechanical device including an active element, wherein the method comprises the following steps:
   a) making a monocrystalline first stop layer on a monocrystalline layer of a first substrate;
   b) growing a monocrystalline mechanical layer epitaxially on said first stop layer out of at least one material that is different from that of the stop layer;
   c) making a sacrificial layer on said active layer out of a material that is suitable for being etched selectively relative to said mechanical layer;
   d) making a bonding layer on the sacrificial layer;
   e) bonding a second substrate on the bonding layer; and
   f) eliminating the first substrate and the stop layer to reveal the surface of the mechanical layer opposite from the sacrificial layer, the active element being made by at least a portion of the mechanical layer.

Prior to depositing the bonding layer, the method may include depositing a second stop layer.

After step c), the method may implement the following steps:
   $c_1$) making at least one trench in the sacrificial layer; and
   $c_2$) filling the trench(es) to form at least one pillar, the pillar being made at least in part out of a material that is different from the material of the sacrificial layer.

Step $c_2$) may comprise:
   $c_{21}$) for at least one trench, partial filling with a first material that is different from the material of the sacrificial layer; and
   $c_{22}$) finishing off the filling with an insulating second material that is different from the first material.

The first material may be selected to be insulating or conductive.

For at least one trench, the method may present partial filling with a first insulating material that is different from the material of the sacrificial layer and of the mechanical layer, and then partial filling of the other trenches with a conductive material, the filling of all of the trenches being terminated by a second insulating material.

The partial filling of at least one trench by a conductive material may include making at least one region covering the surface of the sacrificial layer, to form at least one electrical contact between one or more conductive pillars.

The filling may be performed with the bonding layer.

The second substrate may include at least one electronic circuit, in particular a complementary metal oxide on silicon (CMOS) circuit, and the bonding layer may present localized areas suitable for constituting electrical contacts between the electronic circuit and said contact-making regions.

Prior to step b), the method may include doping at least one localized region of the mechanical layer to enable a piezoresistive sensor to be made.

The material of the stop layer may be selected in particular from SiGe, porous Si, or doped Si.

BRIEF DESCRIPTION OF THE DRAWINGS

Other characteristics and advantages of the invention appear better on reading the following description given by way of non-limiting example and with reference to the accompanying drawings in which FIGS. 1a to 1f and 2a to 2b show two preferred implementations of the invention.

MORE DETAILED DESCRIPTION

The first implementation (FIGS. 1a to 1f) relates to making a mechanical structure out of monocrystalline silicon.

Figure 1A:
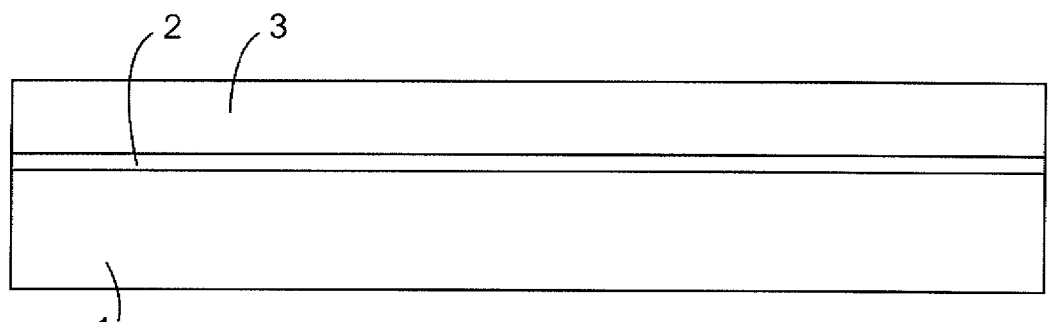
Figure 1B:
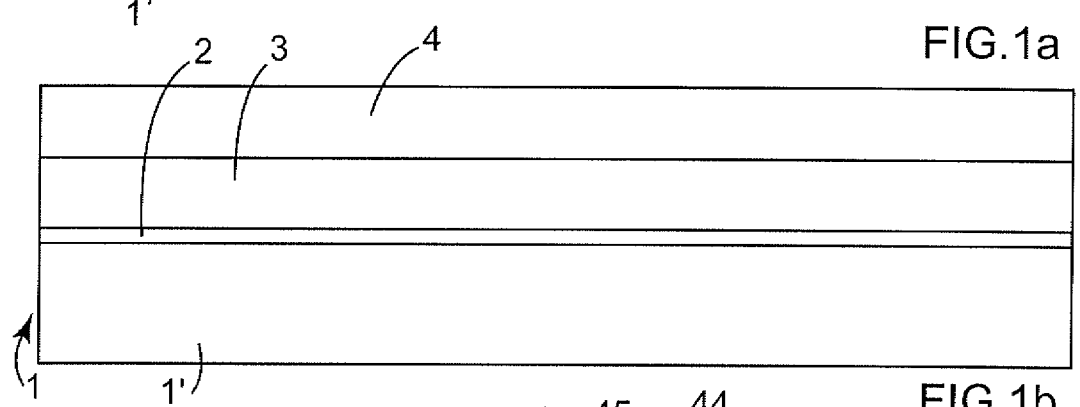

FIG. 1a shows the monocrystalline silicon substrate 1 having a first stop layer 2 formed thereon. This stop layer 2 is made of monocrystalline material that is compatible with growing the mechanical layer 3 epitaxially.

In a first variant, the stop layer 2 is an epitaxially-grown layer of SiGe of thickness of the order of 100 nm.

In a second variant, the stop layer is a layer of porous Si made on the starting substrate by a known method (see for example the article "Using porous silicon as sacrificial layer" by P. Steiner, J. Micromech. Microeng. 3 (1993) 3236).

The mechanical layer 3 of monocrystalline Si is subsequently grown epitaxially to a thickness lying in the range 100 nm to 100 μm depending on the application. With an SiGe stop layer, the Ge content of the SiGe layer lies for example in the range 10 mole percentage (mol %) to 70 mol % so as to minimize the stresses induced in the mechanical layer.

The sacrificial layer 4, e.g. of $SiO_2$, is then deposited by low pressure chemical vapor deposition (LPCVD) or by plasma-enhanced chemical vapor deposition (PECVD) or is obtained by oxidizing the silicon (FIG. 1b) over a depth typically lying in the range 50 nm to a few μm, depending on the application.

Optionally, the sacrificial layer 4 may subsequently be etched locally to make anchor zones. The so-called "interconnection" layer that covers the sacrificial layer 4 may comprise an alternation of areas 44 of SiN (typically 100 nm) for the insulating portions and of areas 45 of polycrystalline Si for the conductive portions, with it being possible for an insulator such as $SiO_2$ to be used for filling the trenches. To make the various levels of interconnection, it is possible to use multiple layers 44 of SiN and 45 of polycrystalline Si.

Figure 1C:
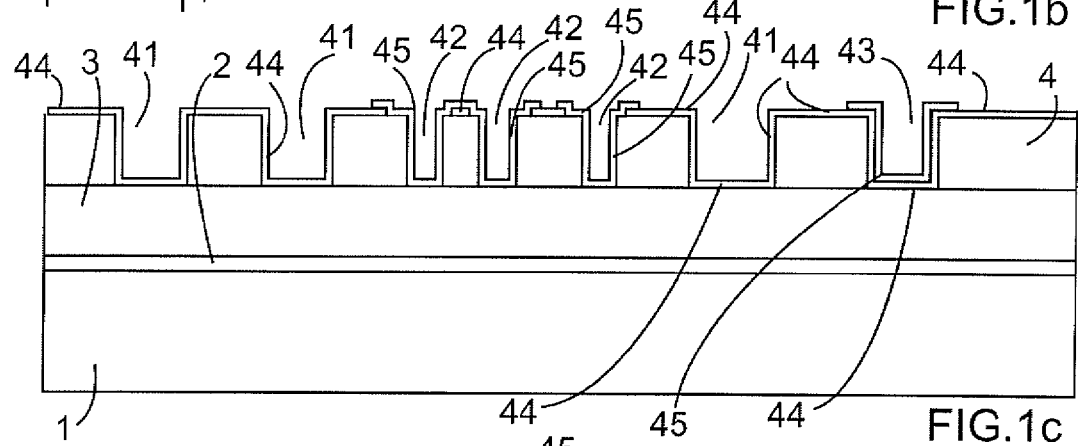
Figure 1D:
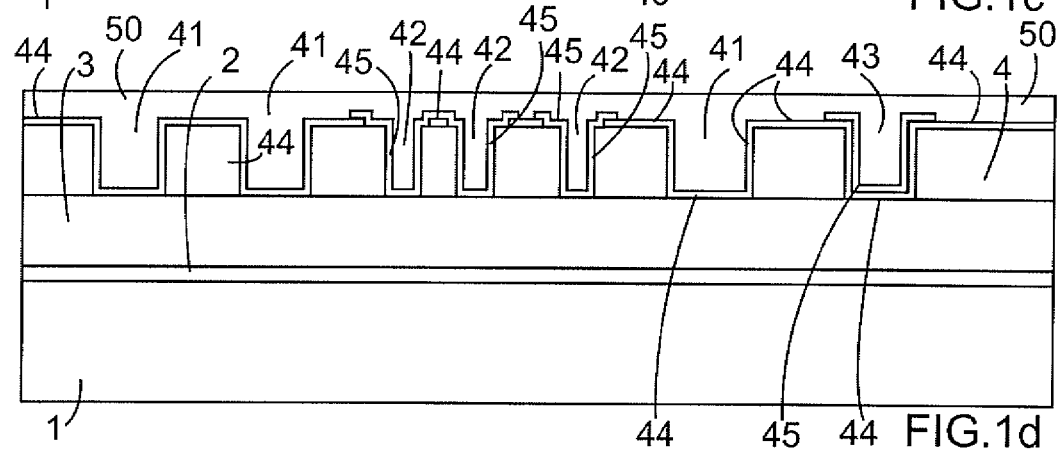

FIG. 1c shows three types of trench.

The or each trench 41 is covered in an insulating layer 44 of SiN, as is the surface of the sacrificial layer 4.

The or each trench 42 is covered in a conductive layer 45 of polycrystalline Si that overlaps onto the surface of the sacrificial layer 4 and possibly onto one end of the insulating layer 44. The layer 45 may be used to interconnect two or more portions of mechanical layer 3 facing the trenches 42, or to make electrodes or conductor tracks on the sacrificial layer.

The or each trench 43 is covered in an insulating layer 44 of SiN, and in a conductive layer 45 of polycrystalline Si, thus making it possible to pass electricity through an insulating etching stop.

The etched zones of the sacrificial layer enable functional structures to be made in the mechanical layer that are locally independent of the support.

The non-etched zones of the sacrificial layer enable so-called "anchor" zones or mechanical reinforcement zones (known as "pillars") to be made. The layers 44 and 45 are referred to as "functionalization" layers since they enable functions to be added to the sacrificial layers, such as: pillars made with etching stops; electrodes under the sacrificial layer; and electrical connections between the mechanical layer and said electrodes, or between portions of the mechanical layer that are not connected together.

When making such a functionalization layer, the surface of the sacrificial layer can thus be covered in a layer that acts as a second stop layer when it covers the sacrificial layer completely. The second stop layer makes it possible to isolate the sacrificial layer chemically from the bonding layer.

In the example shown, the functionalization thus alternates between insulating regions and conductive regions, thereby making it possible to provide contact areas and/or interconnections and/or electrodes, and also to make insulating or conductive etching stops in the sacrificial layer.

The trenches 41, 42, and/or 43 are subsequently filled with $SiO_2$.

The last layer to be deposited is the bonding layer 50, which may be made of $SiO_2$. This layer may be the same as the layer used for filling the cavities 41, 42, 43. Since this layer needs to be perfectly plane, polishing is performed after it has been deposited, or else before deposition, with the layer as deposited subsequently conserving planeness.

Providing anchor zones is merely optional. It is possible to etch the sacrificial layer from wells in the mechanical layer 3 and to leave selected regions of the sacrificial layer in place by controlling the duration of etching. This technique is particularly suitable for MEMS of simple structure and not requiring particular precision.

Figure 1E:
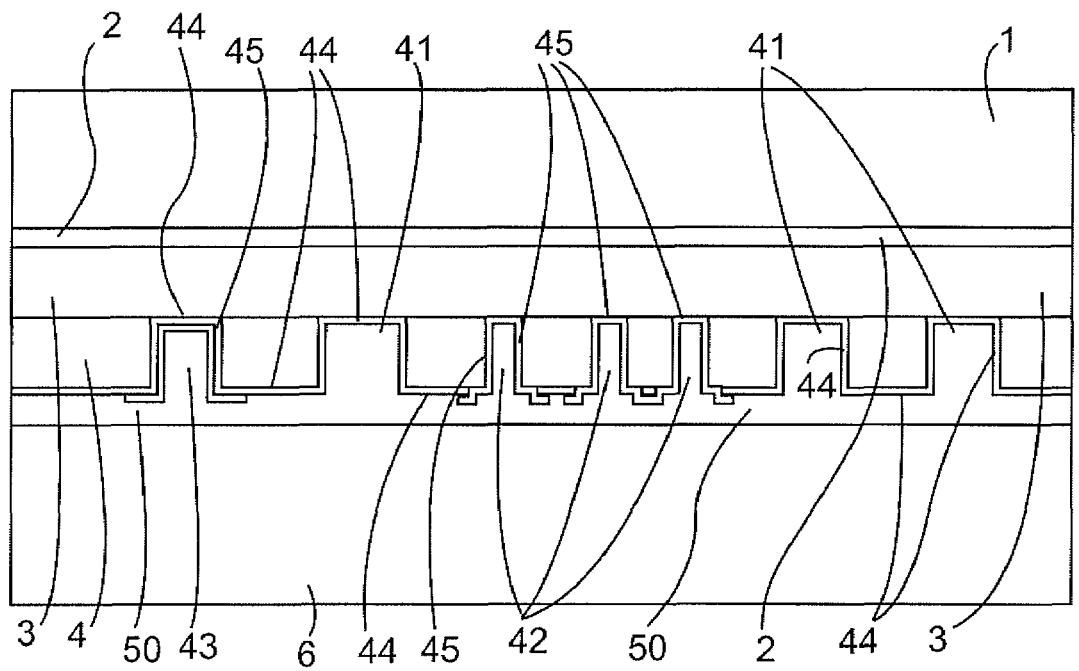
Figure 1F:
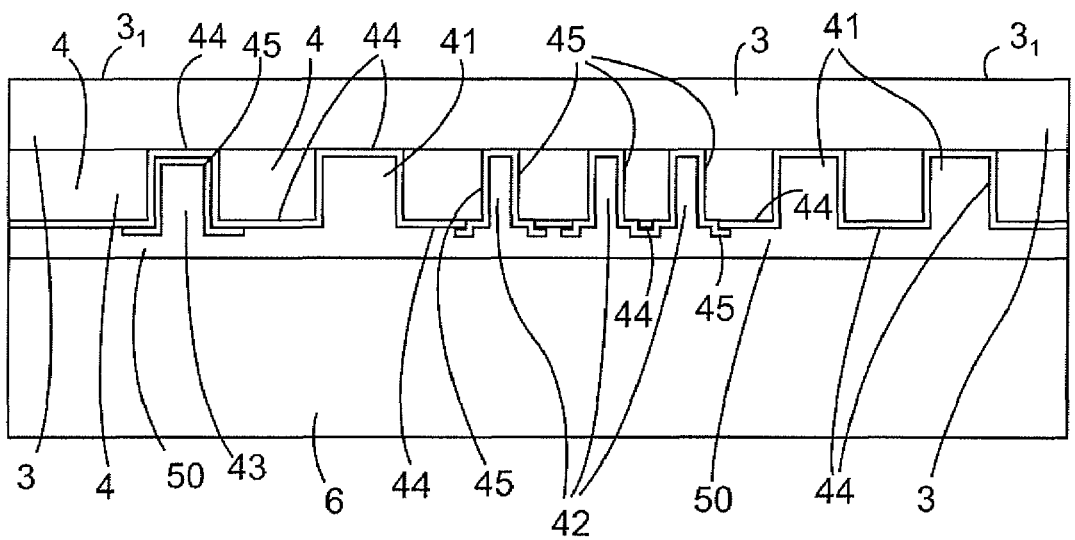

The second substrate 6 is then assembled by molecular bonding (FIG. 1e).

The second substrate 6 may include one or more CMOS circuits. Under such circumstances, the bonding layer 50 is a mixed layer comprising an array of areas of Cu on $SiO_2$ suitable for making contacts between the CMOS portion and the functionalization layer in its region 45 made of polycrystalline Si. The second substrate also includes an identical bonding layer. In this variant, bonding and the following steps must be performed at temperatures that are compatible with CMOS technology. Such bonding is possible since assembly performs a mechanical function only. The bonding layer then allows electrical connections to be make between certain portions of the MEMS and the CMOS circuits. It should be observed that there is no need for all of the areas to be active in making an electrical connection, some of them may be used solely for obtaining sufficient bonding force. Under such circumstances, electrical connection to the CMOS circuit may take place via contacts made on the surface of the MEMS.

The stack is subsequently turned over to give access to the rear face 31 of the first substrate 1.

In the first variant, i.e. the variant with a thin stop layer 2 of SiGe possessing thickness that is typically 100 nm, the first substrate is subsequently rectified down to a thickness of about 10 μm. The thickness is determined by the precision available for this rectification step and also in such a manner that the mechanical layer does not have any remaining work-hardened zones as created during the rectification step. This is thus a function in particular of the desired speed of rectification.

The remaining thickness of Si from the first substrate 1 is subsequently removed by chemical etching, the etching stopping at the layer 2 of SiGe. Various known methods exist for etching Si and stopping at SiGe. Mention can be made of wet etching methods, e.g. using a solution based on tetramethylammonium hydroxide (TMAH) or on KOH, or of dry etching (Japanese Journal of Applied Physics, Vol. 43, No. 6B, 2004, pp. 3964-3966, 2004 The Japan Society of Applied Physics).

In the second variant, the stop layer 2 is a thick porous Si layer (typically about 10 μm thick). Under such circumstances, the substrate 1 is rectified until the stop layer 2 is reached.

Finally, in both variants, the first stop layer 2 is removed by chemical etching, which stops at the Si of the mechanical layer 3 (FIG. 1f), regardless of whether the layer 2 is made of SiGe or of porous Si.

Various known methods exist for etching SiGe and stopping at Si. Mention can be made of high-temperature HCl etching methods (Selective chemical vapor etching of $Si_{1-x}Ge_x$ versus Si with gaseous HCl, by Y. Bogumilowicz, J. M. Hartmann, J. M. Fabri, and T. Billon in Semicond. Sci. Technol. 21, No. 12 (December 2006) pp. 1668-1674), chemical etching methods based on solutions of HNA type (hydrofluoric acid, nitric acid, acetic acid), and dry etching methods (above-mentioned article in Japanese Journal of Applied Physics).

For etching porous Si and stopping on Si, reference can be made for example to the above-mentioned article "Using porous silicon as sacrificial layer" by P. Steiner. Under such circumstances, the stop layer 2 may be oxidized prior to chemical etching in order to increase stop selectivity on the SiGe of the mechanical layer 3.

The method terminates by structuring the mechanical layer 3 by deep reactive ion etching (DRIE) and etching the sacrificial layer 4 (e.g. chemical vapor etching with HF).

For a sensor having a deformable cavity (a pressure sensor or a force sensor), the cavities are selected by a layer of phosphosilicate glass (PSG) or else of SiN or of $SiO_2$ at 300° C. if the stack includes CMOS circuits.

Contacts are reproduced on the top face by making silicon pillars that are locally isolated from the mechanical layer by trenches.

For a sensor requiring a cap (an inertial sensor), it is possible to use a known technique of making a cap by spreading a thin layer.

To make sensors, the proposed method makes it possible to use either capacitive detection or piezoresistive detection. With piezoresistive detection, doping is performed in the mechanical layer 3, preferably before depositing the sacrificial layer, so as to make the necessary piezoresistive strain gauges.

A second embodiment shown in FIGS. 2a and 2b corresponds to an active layer that is not made of monocrystalline silicon.

It is advantageous to be able to use certain thin-layer materials in the form of a monocrystal when that enables physical properties, including small thickness, to be obtained that are close to the properties of a bulk monocrystal or in any event better than the properties obtained by the same material in an amorphous or a polycrystalline phase. In the perovskite family, this applies for example to ferroelectric oxides such as lead zirconate titanate, which can be grown epitaxially from a transition layer of $SrTiO_3$ (STO) on monocrystalline silicon with properties that are potentially better than the properties of amorphous or polycrystalline films made by sol-gel deposition (above-mentioned article by A. Lin et al.).

The first stop layer for controlling thickness comprises a monocrystalline SiGe layer 2 made as in the first embodiment on a substrate 1 of monocrystalline silicon. A transition layer made up of a layer of monocrystalline silicon 61 and a monocrystalline STO perovskite layer 62 is grown epitaxially (STO means for $SrTiO_3$). The piezoelectric stack corresponding to the mechanical layer 3 is made up of monocrystalline $SrRuO_3$ electrodes 63, 64 associated with a PZT piezoelectric layer 66 using a known technique (above-mentioned article by A. Lin et al.). The method is then identical to that described above for making the sacrificial layer 4, possibly including etching stops, making contacts, and the bonding layer. The local etching of the first electrode 63 and of the PZT layer 66 makes it possible, where appropriate, to use the $SrRuO_3$ first layer 63 both for the first electrode and for making an electrical connection 67 to the second electrode (FIG. 2a).

Openings are made in the bulk of the resonant structure so as to release the piezoelectric structure locally using the etching of the sacrificial layer 70, which is performed as described above. The contacts are made on the $SuRuO_3$ layer by locally eliminating the transition layer made of Si and of STO perovskite by etching (FIG. 2b).

The component as obtained in this way is a BAW surface acoustic wave resonator of the thin-film bulk acoustic resonator (FBAR) type, i.e. it is made on a cavity.

What is claimed is:

1. A method of fabricating an electromechanical device including an active element in a mechanical layer having a functional structure that is obtained by selective chemical etching of a sacrificial layer, wherein the method comprises:

a) making a monocrystalline first stop layer on a surface of a monocrystalline layer of a first substrate;
b) growing a monocrystalline mechanical layer epitaxially on a surface of said first stop layer out of at least one material that is different from that of the stop layer, wherein said monocrystalline mechanical layer is non-strained;
c) making a sacrificial layer on a surface of said mechanical layer out of a material that is suitable for being etched selectively relative to said mechanical layer;
d) making a bonding layer on the sacrificial layer;
e) bonding a second substrate on the bonding layer; and
f) successively eliminating the first substrate and said stop layer to reveal said surface of the mechanical layer opposite from the sacrificial layer, said stop layer acting as a stop layer for the elimination of the first substrate.

2. A method according to claim 1, wherein, prior to depositing the bonding layer, it includes depositing a second stop layer.

3. A method according to claim 1, wherein, after step c), it implements the following steps:
$c_1$) making at least one trench in the sacrificial layer; and
$c_2$) filling the trench(es) to form at least one pillar, the pillar being made at least in part out of a material that is different from the material of the sacrificial layer.

4. A method according to claim 3, wherein step $c_2$) comprises:
$c_{21}$) for at least one trench, partial filling with a first material that is different from the material of the sacrificial layer; and
$c_{22}$) finishing off the filling with an insulating second material that is different from the first material.

5. A method according to claim 4, wherein the first material is an insulating material.

6. A method according to claim 4, wherein the first material is a conductive material.

7. A method according to claim 4, wherein for at least one trench, it presents partial filling with a first insulating material that is different from the material of the sacrificial layer and of the mechanical layer, and then partial filling of the other trenches with a conductive material, the filling of all of the trenches being terminated by a second insulating material.

8. A method according to claim 4, wherein the partial filling of at least one trench by a conductive material includes making at least one region covering the surface of the sacrificial layer, to form at least one electrical contact between one or more conductive pillars.

9. A method according to claim 1, wherein the filling is performed with the bonding layer.

10. A method according to claim 1 and claim 6, wherein the second substrate includes at least one electronic circuit, in particular a CMOS circuit, and wherein the bonding layer presents localized areas suitable for constituting electrical contacts between the electronic circuit and said contact-making regions.

11. A method according to claim 1, wherein, prior to step b), it includes doping at least one localized region of the mechanical layer to enable a piezoresistive sensor to be made.

12. A method according to claim 1, wherein the stop layer is made of SiGe.

13. A method according to claim 1, wherein the stop layer is made of porous Si.

14. A method according to claim 1, wherein the stop layer is made of doped Si.

* * * * *